Nov. 8, 1960 T. R. O'MEARA 2,959,674

GAIN CONTROL FOR PHASE AND GAIN MATCHED MULTI-CHANNEL RADIO RECEIVERS

Filed July 2, 1957 2 Sheets-Sheet 1

INVENTOR.

THOMAS R. O'MEARA

BY

W. R. Matt...
Paul M. Klein Jr.

ATTORNEYS

INVENTOR.
THOMAS R. O'MEARA
BY
W.R. McAttee
Paul M. Klein Jr.
ATTORNEYS

United States Patent Office 2,959,674

Patented Nov. 8, 1960

2,959,674

GAIN CONTROL FOR PHASE AND GAIN MATCHED MULTI-CHANNEL RADIO RECEIVERS

Thomas R. O'Meara, Los Angeles, Calif., assignor, by mesne assignments, to the United States of America as represented by the Secretary of the Navy Filed July 2, 1957, Ser. No. 669,691

3 Claims. (Cl. 250—20)

This invention relates to a gain control for electronic amplifiers and more particularly to a gain control for phase and gain matched multi-channel radio receivers.

An object of the present invention is to provide an apparatus for controlling the gain in all of the channels of a multi-channel radio receiver simultaneously in such a way that they remain phase and gain matched for all gain control settings.

Figure 1:
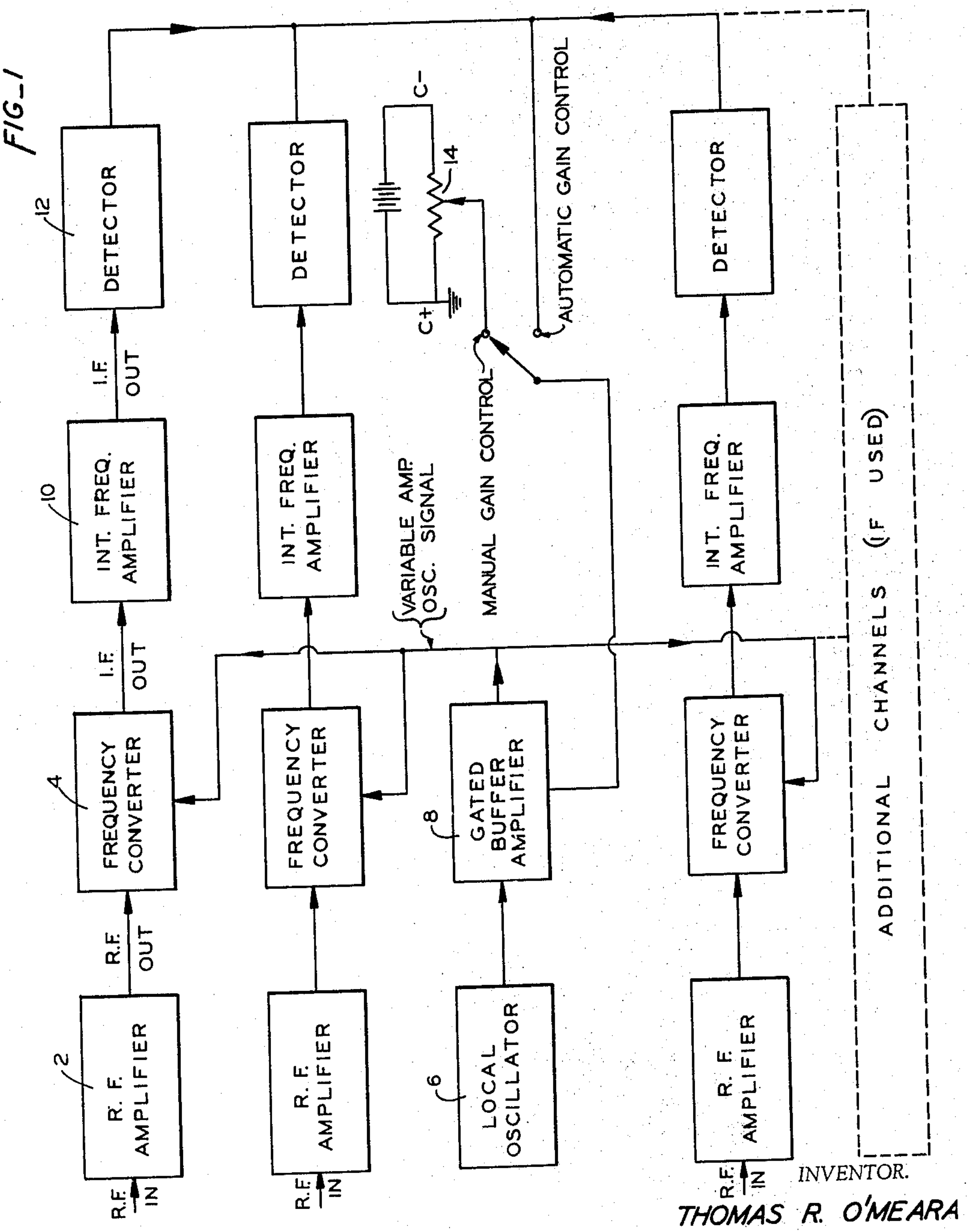
Figure 2:
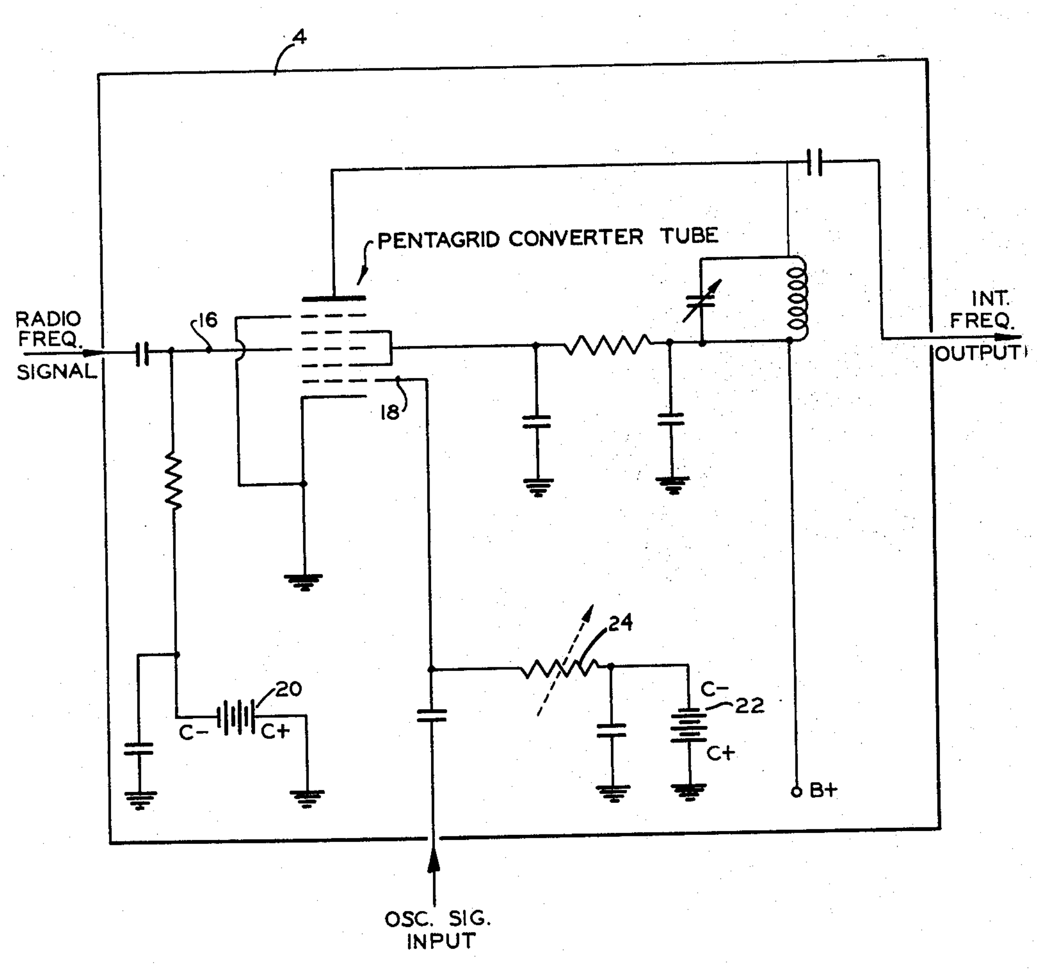

Other objects and many of the attendant advantages of this invention will be readily appreciated as the same becomes better understood by reference to the following detailed description when considered in connection with the accompanying drawings wherein:

Fig. 1 is a block diagram of a multi-channel radio receiver using the invention; and Fig. 2 is a circuit diagram of the frequency converter stage of Fig. 1.

Reference is now made to the drawing. In Fig. 1 there is shown a multi-channel radio receiver, each channel of which includes a RF amplifier 2 which feeds into a frequency converter 4 to which is also supplied a voltage from a local oscillator 6 through a gated buffer amplifier 8, the local oscillator 6 supplying a voltage common to all channels. The output of the frequency converter 4 is fed to an intermediate frequency amplifier 10 and thence to a detector 12. The output of the several detectors is shown as being alternatively available to operate an automatic gain control in place of the manual gain control 14 operating on the gated buffer amplifier 8.

In Fig. 2 some circuitry details of the converter stage 4 are shown. Each such stage includes a pentagrid converter tube or the like onto one control grid 16 of which (designated the signal grid) is fed the RF signal from the RF amplifier 2. On to another control grid 18 of the converter tube is fed the oscillator signal voltage emanating from the amplifier 8. A battery 20 serves to maintain a stabilized D.C. bias on the grid 16 and a battery 22 serves to maintain a stabilized D.C. bias on the grid 18.

*Operation*

The gains of all of the channels of the receiver are controlled by varying the amount of the common oscillator voltage generated by the local oscillator 6 injected at the oscillator grid 18 of each of the frequency converter tubes in the frequency converter stage of each channel. Any conventional system can be used to provide the control of the injected oscillator voltage. One entirely satisfactory way of accomplishing this is in the illustrated embodiment wherein a buffer amplifier 8 is provided whose gain is varied by changing the negative bias of the control grid of the buffer tube. This variable bias may come from a potentiometer such as shown at 14 to give a manual gain control or may come from a rectifier at the outputs of the receiver intermediate frequency amplifiers to give an automatic gain control system similar to the conventional variety.

In order to insure good channel to channel matching or balance, the frequency changer stage must be of the linear type. By a linear type frequency changer is meant a device with output current or voltage which is a linear function of either the RF input signal or local oscillator signal alone and with a conversion transconductance characteristic which varies linearly with the magnitude of the voltage at the local oscillator input to the device. This means that, if instead of being an alternating voltage, the RF signal input to the device were maintained at a constant D.C. voltage and the oscillator signal were replaced by a D.C. voltage excursion, then a plot of the output current or voltage of the device versus the local oscillator signal voltage would be a straight line. Similarly, if the local oscillator signal voltage input to the device were kept at a constant D.C. value, instead of being an A.C. signal, and the RF input signal were replaced by a D.C. voltage excursion, then a plot of the output current or voltage versus the RF input (D.C. excursion) voltage would be a straight line.

The invention accomplishes the desired result with the use of a multigrid vacuum tube such as the usual pentagrid converter tube operated under certain special conditions. The D.C. bias on both the signal grid 16 and the oscillator grid 18 is such as to place the operating point of the tube into the center of the aforedescribed linear region. The proper bias for each grid can be determined by plotting a family of curves of plate current versus signal grid voltage. Each of the curves is plotted for a different value of fixed D.C. voltage applied to the oscillator grid. These values of fixed D.C. voltages are separated by equal increments. A D.C. bias voltage for each grid is then selected which will place the operating point in the region wherein the curves of this family are straight lines and where three adjacent members of the family of curves intercept equal distances on a line of constant signal grid voltage. During operation, the oscillator grid voltage would normally be maintained sufficiently low so that no grid current flows and the tube remains in the linear region. Stabilized D.C. bias is maintained on both grids, preferably by external fixed bias such as the battery shown since this gives better results than the usual cathode bias. By choosing the operating points in this manner one is assured that, when the D.C. voltage excursions are replaced by an A.C. signal voltage (or an A.C. oscillator voltage), the amplitude of that component of the output signal occurring at the sum (or difference) frequency will vary linearly with the amplitude of the signal (or oscillator) voltage up to the largest possible signal amplitude in either case. Thus a large dynamic range of signal amplitude may result, wherein the gain control remains precise (i.e. matched).

With the arrangement described the potentiometer 14 or the alternative automatic gain control serves to match variations in gain on all channels simultaneously and maintains the phases matched also. In order to match the absolute gains of the channels, that is the actual gains, it suffices to make one initial adjustment, preferably near the output, by, for example, attenuating the gain of one channel relative to another to which it is to be matched. Once this initial adjustment is made and the two channels start out with identical gains, then the variation in their gains will be identical and the phases will remain matched.

From the foregoing it is seen that a gain control system has been provided which requires no special matching of tubes or other components and requires no particular additional adjustment to balance the gain control system operation.

In the special case where the signal applied to the oscillator grid 18 is a D.C. voltage (variable in value), which may be regarded as the instance where the frequency of the local oscillator is zero, then the output signal from the frequency converter is at the same frequency as the input RF signal. In a practical situation this D.C. case can be put into practice by disconnecting the oscillator signal input in Fig. 2 and varying the resistor 24 to obtain different D.C. voltages on grid 18. The device would then properly no longer be designated as a frequency converter but rather would become a gain-controlled amplifier whereas, when operated with a controlled amplitude, A.C. voltage on the oscillator grid, the device could all-embracingly have been designated as a combined frequency converter and gain control. The special D.C. case has certain characteristics which distinguish it from the frequency changer or dynamic case where an A.C. voltage is applied to the oscillator grid 18. Since the gain of the D.C. operated amplifier cannot be reduced to zero or even extremely low values, therefore the obtainable dynamic control ranges of the D.C. operated amplifier are far less than for the frequency changer type of gain control. However, the gain of the D.C. operated amplifier is considerably greater than that of the frequency changer type. Assuming that the amplifier is operated in the linear portion of that one of the family of curves of plate current versus signal grid voltage for which the oscillator grid voltage is held at zero volts, the amplifier is operated at full gain. In contrast, when applying to the oscillator grid the maximum possible A.C. oscillator signal input which it is possible to apply under the condition of maintaining the operation of the tube within the aforedescribed linear region, the tube, operating thus as a frequency changer (in addition to being an amplifier) is low in gain even compared to normal, class C operation of the same tube. As the generated plate noise is comparable in the two devices, the D.C. device will have a considerable noise figure advantage over the frequency changer.

From the foregoing it is apparent that, in a sense, the two devices complement each other and can be combined to advantage in one receiver with at least one relatively low noise, D.C. controlled, RF amplifier (with some dynamic range) followed by a relatively high noise frequency changer, whose magnitude of oscillator injection voltage provides the remainder of the receiver dynamic range, i.e. the largest part of the dynamic range.

Obviously many modifications and variations of the present invention are possible in the light of the above teachings. It is therefore to be understood that within the scope of the appended claims, the invention may be practiced otherwise than as specifically described.

What is claimed is:

1. A radio receiver comprising a plurality of channels, each of said channels including a radio frequency amplifier stage and a frequency converter stage; each said frequency converter stage comprising a multigrid vacuum tube; means biasing, with a stabilized direct current bias, the signal grid and the oscillator grid of each said tube into the region where the output voltage of said tube is a linear function of either the radio frequency input signal or the local oscillator signal alone; each said radio frequency amplifier stage supplying radio frequency signal to the signal grid of the tube of its respective frequency converter stage at such a voltage as to maintain said tube within said linear region; a local oscillator; means for supplying common oscillator voltage from said oscillator to the oscillator grid of each said tube; and means for controlling the magnitude of said oscillator voltage while maintaining it sufficiently low that each said frequency converter tube remains in said linear region and that no grid current flows, whereby to vary the gain of said channels while said channels remain phase and gain matched for all gain control settings.

2. The apparatus of claim 1 wherein said last named control means includes a manually adjustable element for accomplishing the controlling function.

3. The apparatus of claim 2 further including an intermediate frequency amplifier stage and a detector stage in each of said channels and wherein said last named controlled means includes an automatic gain controll responsive to the output of said detector stages.

References Cited in the file of this patent

UNITED STATES PATENTS

| | | |
|---|---|---|
| 1,913,428 | Bruce | June 13, 1933 |
| 1,916,358 | Bruce et al. | July 4, 1933 |
| 1,985,924 | Hansell | Jan. 1, 1935 |
| 2,074,014 | Chittick et al. | Mar. 16, 1937 |
| 2,144,935 | Roberts | Jan. 24, 1939 |
| 2,743,421 | Meyer | Apr. 24, 1956 |

OTHER REFERENCES

Book "Radio Receiver Design" by Sturley, Second edition, Part I, John Wiley & Sons, 1953, page 290.